(12) United States Patent
Lee et al.

(10) Patent No.: US 6,738,290 B2
(45) Date of Patent: May 18, 2004

(54) SEMICONDUCTOR MEMORY DEVICE

(75) Inventors: June Lee, Seoul (KR); Young-Ho Lim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 69 days.

(21) Appl. No.: 10/191,673

(22) Filed: Jul. 8, 2002

(65) Prior Publication Data
US 2003/0031054 A1 Feb. 13, 2003

(30) Foreign Application Priority Data

Aug. 7, 2001 (KR) ........................................ 2001-47478

(51) Int. Cl.[7] .............................................. G11C 16/04
(52) U.S. Cl. .............................. 365/185.17; 365/185.05
(58) Field of Search ........................ 365/185.17, 185.05

(56) References Cited

U.S. PATENT DOCUMENTS 5,508,957 A * 4/1996 Momodomi et al. ... 365/185.17
5,712,818 A    1/1998 Lee et al.

* cited by examiner

*Primary Examiner*—David Nelms
*Assistant Examiner*—Tu-Tu Ho
(74) *Attorney, Agent, or Firm*—Marger Johnson & McCollom, P.C.

(57) ABSTRACT

A NAND-type flash memory device has a shared string and or ground selecting line structure, in which string and/or ground selecting lines of adjacent memory blocks are electrically connected to each other so that string/ground selecting transistors, adjacent along a string, can share a butting contact. Thus, a layout area along a wordline is reduced in proportion to the number of reduced butting contacts.

26 Claims, 9 Drawing Sheets

SEMICONDUCTOR MEMORY DEVICE

RELATED APPLICATION

This application claims for priority from Korean Patent Application No. 2001-47478, filed on Aug. 7, 2001, the contents of which are herein incorporated by reference in their entirety.

TECHNICAL FIELD

This disclosure relates to a data storage device and, more particularly, to an electrically erasable and programmable flash memory device.

BACKGROUND OF THE INVENTION

An electrically erasable and programmable flash memory device continuously holds data even though a power is not applied. Particularly, a NAND-type flash memory device has a string structure in which a plurality of flash memory cells are serially connected to each other, so that it is appropriate for integration and can be offered at a low price. Therefore, the NAND-type flash memory device is used as a data memory of various portable products.

Recently, demand for flash memory devices has increased. One of the request is for enhancement of data input/output speed. By increasing a page size (or page depth) and a memory block size, the data input/output speed can be enhanced. The "page" is made of a group of memory cells selected at the same time as activation of one wordline, and is a basic unit of read and program operations. The "memory block" is in turn made of a group of a several pages, and is a basic unit of an erase operation.

Referring now to FIG. 1, a conventional NAND-type flash memory device includes a memory cell array 10, a page buffer circuit (or data sensing and latching circuit) 14, and a column decoder circuit 16. The memory cell array 10 is made of a plurality of memory blocks BLK0–BLKn, (n being a positive integer) each including a plurality of strings. Each of the strings is made of a string selecting transistor SST coupled to a corresponding bitline (e.g., BL0), a ground selecting transistor GST coupled to a common source line CSL, and memory cells MC15–MC0 serially connected between the string and ground selecting transistors SST and GST. The string selecting transistor SST, the memory cells MC15–MC0, and the ground selecting transistor GSL are coupled to a string selecting line SSL, wordlines WL15–WL0, and a ground selecting line GSL, respectively. Block selecting transistors BS17–BL0 are commonly controlled by a block selecting signal BS.

A row selecting circuit 12 selects one wordline (or page) out of the wordlines WL0–WL15 by controlling block selecting transistors BS0–BS17. The page buffer circuit 14 temporarily stores data to be stored in memory cells of a selected page or senses the data stored therein. The page buffer circuit 14 is made of a plurality of page buffers (or data sensing and latching blocks) each corresponding to columns (i.e., bitlines) associated with a selected page. The detailed operations of such a page buffer are disclosed in U.S. Pat. No. 5,712,818, the teachings of which are hereby incorporated herein. Data bits sensed from memory cells of a selected page are output from the memory device with a predetermined unit (e.g., byte unit: x8).

The page size and block size are decided with hardware while designing a flash memory. Unlike a NOR-type flash memory reading data by a random access of a byte (x8) or word (x16) unit, the NAND-type flash memory device senses or latches data with a page unit for a relatively long time (e.g., dozens of microseconds) using the page buffer circuit 14. An nREx pin is toggled to fetch the latched data with a "x8" unit by a data processing system (e.g., CPU). Therefore, the NAND-type flash memory needs a relatively long latency in data reading. But a data output speed of the NAND-type flash memory is high once a page buffer circuit senses and latches data.

It is well known that each of the memory cells constituting a cell string is made of a floating gate transistor having a source, a drain, a floating gate, and a control gate. The control gate of the respective floating gate transistors is connected to a wordline. Since each of the memory cells constituting the cell string is made of the floating gate transistor, for the string and ground selecting transistors acting as a conventional NMOS transistor, the first polysilicon layer for a floating gate and the second polysilicon layer for a control gate must be electrically coupled. This is described more fully herein below.

Referring now to FIG. 2, wordlines and ground selecting lines of each memory block (e.g., an ith memory block and an (i+1)th memory block) are formed by a self-aligned manner. In the ith memory block BLKi, a floating gate and a control gate of a ground selecting transistor GSTi are electrically connected to each other by a metal M1 (e.g., tungsten) in order to act as a conventional NMOS transistor. Likewise, in the (n+1)th memory block, a floating gate and a control gate of a string selecting transistor SSTi+1 are electrically connected to each other by the metal M1 (e.g., tungsten) in, order to act as the conventional NMOS transistor.

To accomplish this, a contact hole is formed so that the polysilicon floating gate can be exposed. The contact hole is filled with a metal so that the polysilicon for a control gate and the polysilicon for a floating gate can electrically contact each other. A contact formed through these steps is so-called "butting contact". In each of the memory blocks, the butting contact increases the layout area along a row or wordline. Furthermore, the butting contact increases the layout area along a string. Such a phenomenon can cause serious problems as integration density becomes high.

SUMMARY OF THE INVENTION

Embodiments of the present invention provide a NAND-type flash memory device having a shared selecting line structure. Also, embodiments of the invention provide a reduced area shared by a butting contact of a string/ground selecting transistor.

A further understanding of the nature and advantage of the invention herein may be realized by reference to the specification and the attached drawings.

DESCRIPTION OF THE PREFERRED EMBODIMENT

In a NAND-type flash memory device according to embodiments of the invention, string/ground selecting lines of adjacent memory blocks are electrically connected to each other so that string/ground selecting transistors, adjacent along a string, can share a butting contact. Based on this structure, a layout area along a wordline may be reduced in proportion to the number of reduced butting contacts. Likewise, a layout area along a bitline may also be reduced. This will be explained in detail below.

Figure 3:
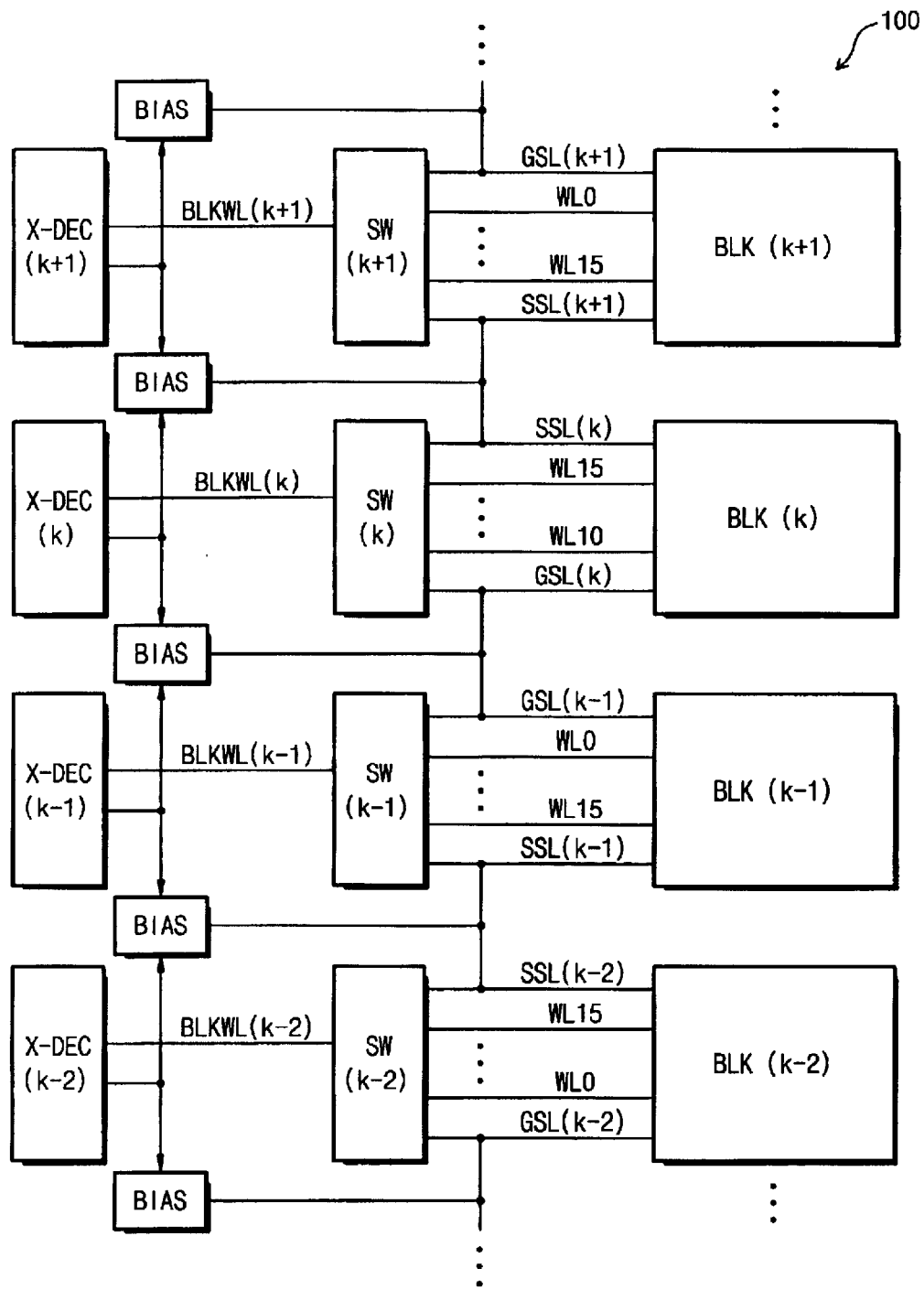
FIG. 3 is a block diagram of a NAND-type flash memory device according to an embodiment of the present invention.
Figure 4:
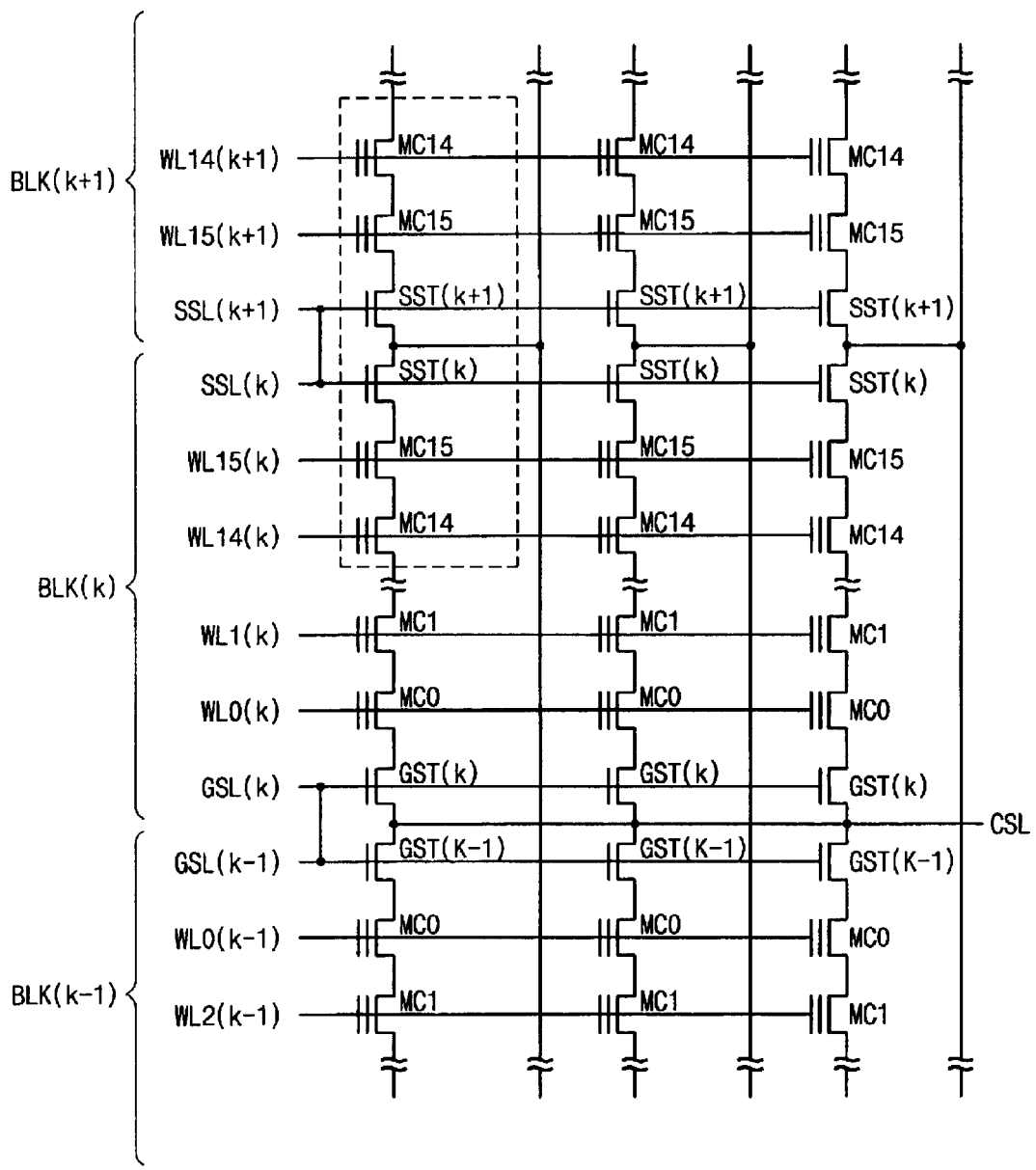
FIG. 4 is a circuit diagram of the memory block illustrated in FIG. 3.

Referring now to FIG. 3, a NAND-type flash memory device 100 includes a plurality of memory blocks. In FIG. 3, four memory blocks BLK(k+1), BLK(k), BLK(k−1), and BLK(k−2) are illustrated. In each of the memory blocks BLK(k+1), BLK(k), BLK(k−1), and BLK(k−2), a plurality of wordlines WL0–WL15 and a ground selecting line GSL are disposed in parallel to the orthogonal direction of a row or bitline. Each memory block includes cell strings each corresponding to their bitlines. In the memory block (e.g., BLK(k)), each of the cell strings is made of a string selecting transistor SST(k) coupled to a corresponding bitline (e.g., BLm), a ground selecting transistor GST(k) coupled to a common source line CSL, and memory cells MC15–MC0 serially connected between the string and ground selecting transistors SST(k) and GST(k), as shown in FIG. 4. The string selecting transistor SST(k), the memory cells MC15–MC0, and the ground selecting transistor GST(k) are coupled to a string selecting line SSL(k), wordlines WL15–WL0, and a ground selecting line GSL(k), respectively.

As illustrated in FIG. 3 and FIG. 4, string selecting lines of adjacent memory blocks are electrically connected to each other, and ground selecting lines thereof are electrically connected to each other. For example, the string selecting line SSL(k) of the memory block BLK(k) is electrically connected to a string selecting line SSL(k+1) of an adjacent memory block BLK(k+1). String/ground selecting transistors, adjacent along a bitline, share a butting contact to achieve the electrical connection between adjacent string/ground selecting lines.

Figure 1:
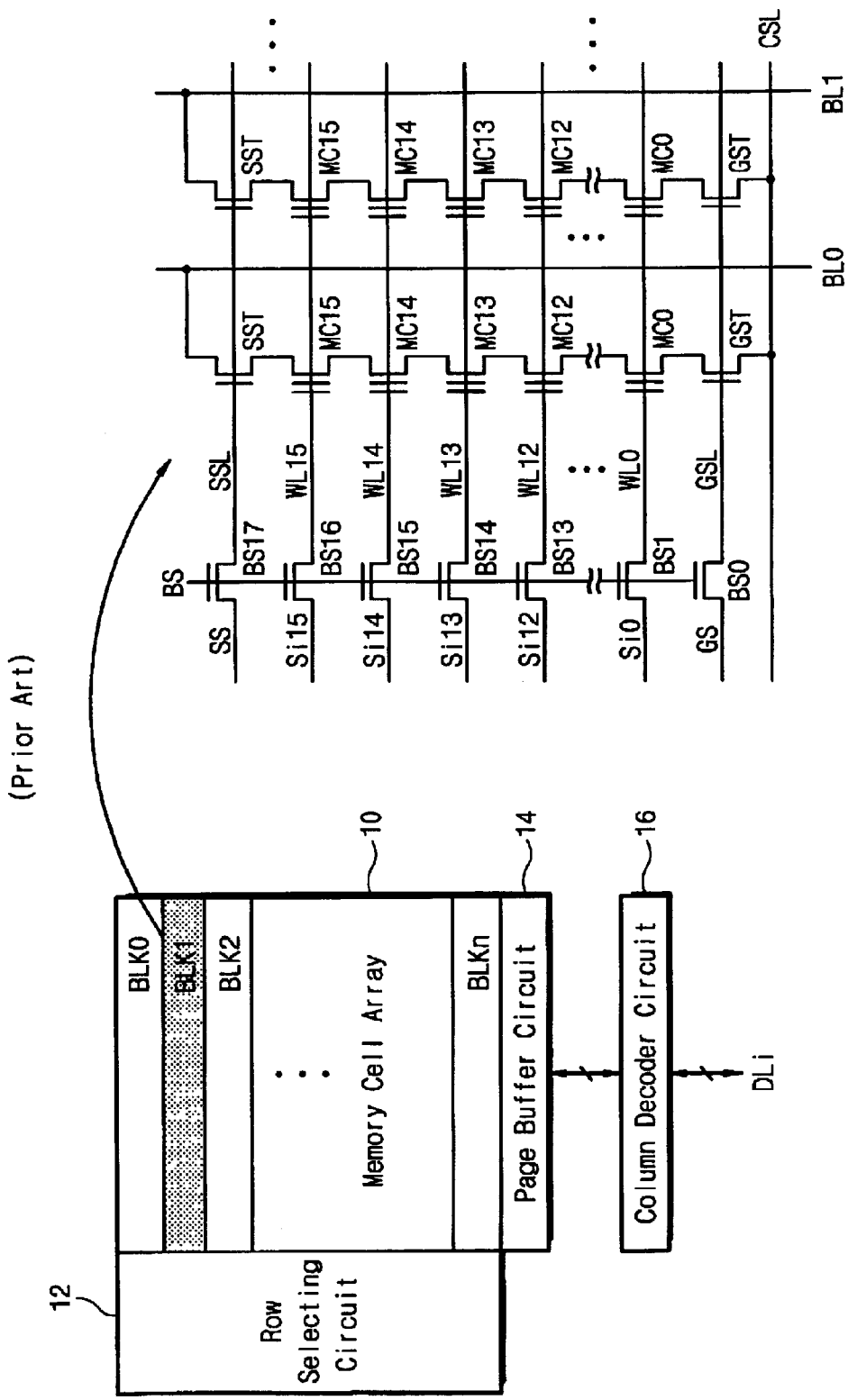
FIG. 1 is a block diagram of a conventional NAND-type flash memory device.
Figure 2:
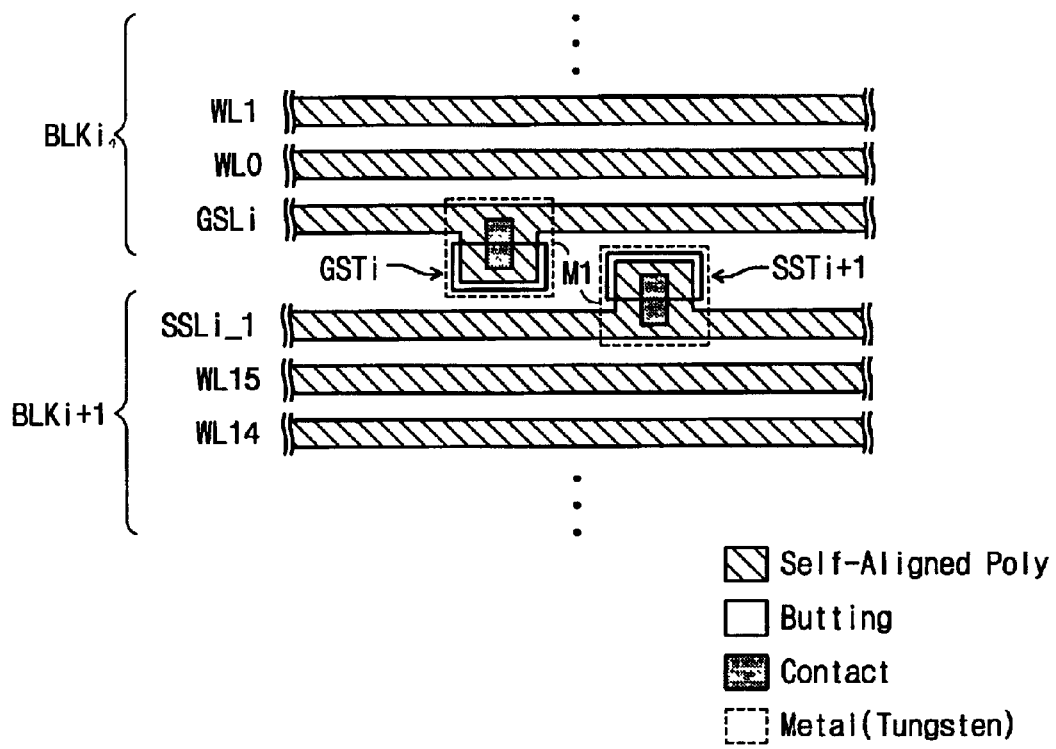
FIG. 2 is a top plan view showing a layout of wordlines and selecting lines of each memory block illustrated in FIG. 1.
Figure 5:
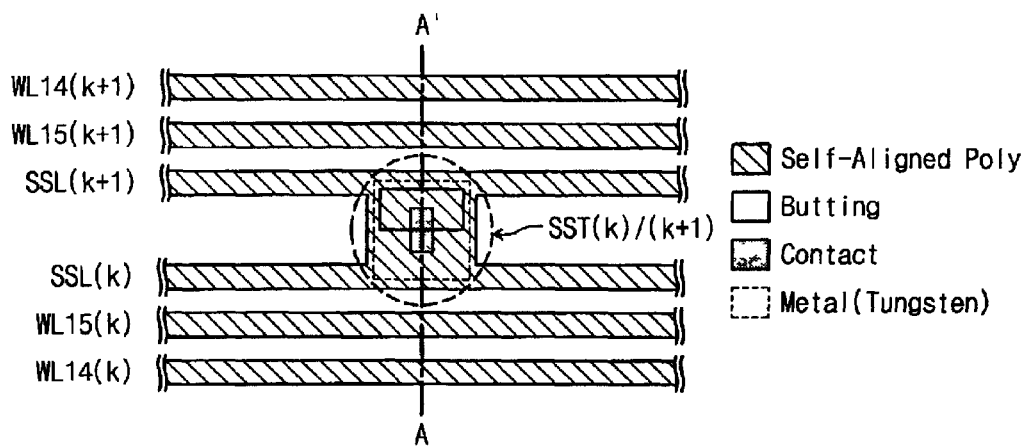
FIG. 5 is a top plan of the dotted portion illustrated in FIG. 4.
Figure 6:
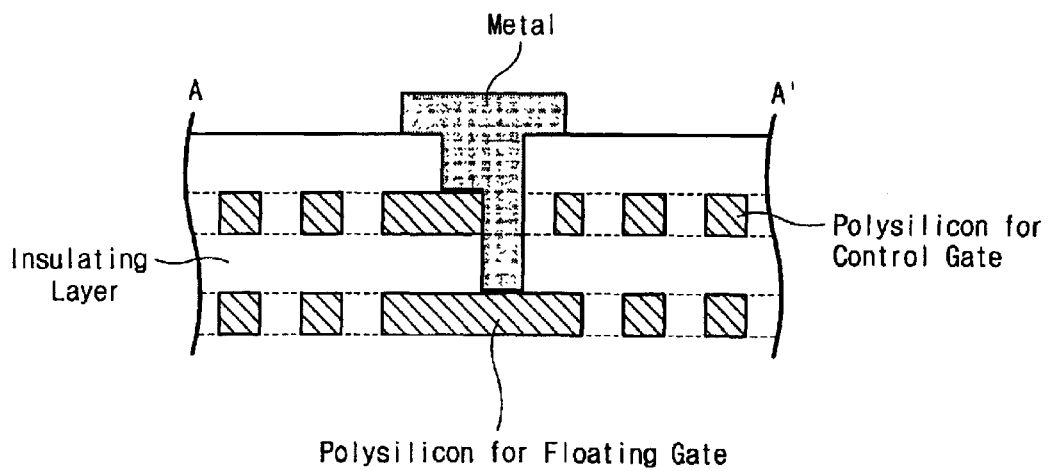
FIG. 6 is a cross-sectional view taken along the A–A' line of FIG. 5.

The "butting contact" means that a floating gate and a control gate of a floating gate transistor are electrically connected to each other in order to act as a normal transistor. A layout structure for sharing the butting contact is illustrated in FIG. 5. To share a butting contact of a string/ground selecting transistor, adjacent string selecting transistors SST(k) and SST(k+1) are formed to act as one transistor. Compared with the layout structure shown in FIG. 2, in this layout structure, an area along a wordline as well as an area along a bitline is reduced. A butting contact structure of the string/ground selecting transistor is illustrated in FIG. 6. Polysilicon for a floating gate is electrically connected with polysilicon for a control gate via a metal.

In a case where a string selecting line SSL(k) of a memory block BLK(k) is electrically connected to a string selecting line SSL(k+1) of a memory block BLK(k+1), the memory blocks BLK(k) and BLK(k+1) are symmetrically disposed on the basis of the string selecting lines that are electrically connected to each other. Likewise, in a case where a ground selecting line GSL(k) of the memory block BLK(k) is electrically connected to a ground selecting line GSL(k−1) of a memory block BLK(k−1), the memory blocks BLK(k) and BLK(k−1) are symmetrically disposed on the basis of the ground selecting lines GSL(k) and GSL(k−1) that are electrically connected to each other.

Returning to FIG. 3, the NAND-type flash memory device 100 includes row decoders X-DEC each corresponding to their memory block and block selecting switch circuits SW. Each row decoder activates or inactivates a block wordline in response to block address information. For example, the row decoder X-DEC(k) corresponding to the kth memory block BLK(k) activates/inactivates a block wordline BLKWL(k) in response to the block address information. Each block selecting switch circuit electrically connects driving lines to a string selecting line, wordlines, and a ground selecting line according to a logic state of a corresponding block wordline. This will be explained in detail below.

Further, the NAND-type flash memory device 100 includes a plurality of bias circuits BIAS each biasing shared string/ground selecting lines of adjacent memory blocks according to an operation mode. Each of the bias circuits BIAS operates in response to block selecting information provided from row decoders corresponding to adjacent memory blocks. The bias circuit is made for preventing an unwanted current path in unselected memory blocks adjacent to both sides of a selected memory block. This will be explained in detail below.

Figure 7:
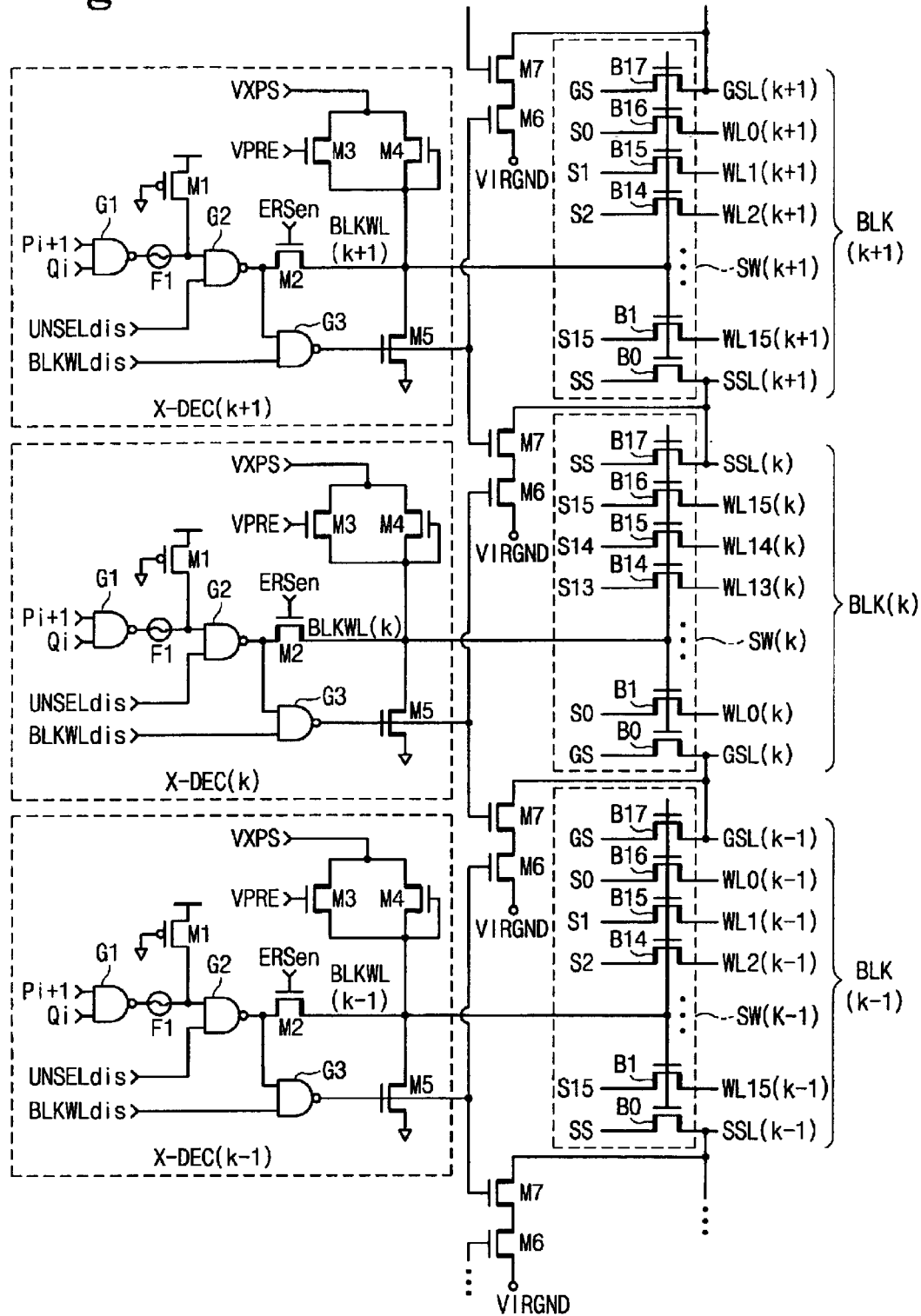
FIG. 7 is a circuit diagram showing a row decoder, a bias circuit, and a block selecting switch circuit illustrated in FIG. 3.

Referring now to FIG. 7, because a row decoder corresponding to each of memory blocks and a block selecting switch circuit have the same construction, a row decoder X-DEC(k) and a block selecting switch circuit SW(k) associated with one memory block (e.g., BLK(k)) are described. The block selecting switch circuit SW(k) includes a plurality of NMOS transistors (or block selecting transistors) B0–B17. Gates of the NMOS transistors B0–B17 are commonly connected to a block wordline BLKWL(k) of a corresponding row decoder X-DEC(k). The NMOS transistors B0–B17 are constructed to connect a string selecting line SSL(k), wordlines WL15(k)–WL0(k), and a ground selecting line GSL(k) to corresponding driving lines SS, S15–S0, and GS, respectively. The string selecting line SSL(k) of the memory block BLK(k) is electrically connected to a string selecting line SSL(k+1) of the memory block BLK(k+1). The ground selecting line GSL(k) of the memory block BLK(k) is electrically connected to a ground selecting line GSL(k−1) of an adjacent memory block BLK(k−1).

Still referring to FIG. 7, the row decoder X-DEC(k) is made of three NAND gates G1, G2, and G3, one fuse F1, one PMOS transistor M1, and four NMOS transistors M2–M5. To the NAND gate G1, block address signals Pi and Qj are provided as block selecting information. The fuse F1 is connected between one input terminal of the NAND gate G2 and an output terminal of the NAND gate G1. A control signal UNSELdis is provided to another input terminal of the NAND gate G2. The PMOS transistor M1, having a grounded gate, is connected between one input terminal of the NAND gate G2 and a power supply voltage. The NMOS transistor M2 is connected between an output terminal of the NAND gate G2 and a block wordline BLKWL(k). A control signal ERSen is applied to a gate of the NMOS transistor M2. One input terminal of the NAND gate G3 is connected to an output terminal of the NAND gate G2, and another input terminal thereof is connected to a control signal BLKWLdis. The NMOS transistor M5 is connected between the block wordline BLKWL(k) and a ground voltage, and is controlled by an output signal of the NAND gate G3. The diode-coupled NMOS transistor M4 is connected between a VXPS voltage and the block wordline BLKWL(k), and the NMOS transistor M3 is also connected therebetween. A gate of the NMOS transistor M3 is coupled to a VPRE voltage. Operations of the row decoder will be explained in detail below.

A bias circuit made of two NMOS transistors M6 and M7 is coupled to shared ground/string selecting lines, respectively. For example, in a bias circuit BIAS coupled to shared ground selecting lines GSL(k) and GSL(k−1), the NMOS transistors M6 and M7 are serially connected between a shared ground selecting line GSL(k) and a voltage supply terminal VIRGND of the memory block BLK(k). The NMOS transistor M6 is controlled by an output signal of a NAND gate G3 in the row decoder X-DEC(k), while the NMOS transistor M7 is controlled by an output signal of a NAND gate G3 of the row decoder X-DEC(k+1). When the block address signals Pi and Qj are high and the control signals UNSELdis and BLKWLdis are high, i.e., the memory block BLK(k) is selected, the output signal of the NAND gate G3 is made low. When at least one of the block address signals Pi and Qj is low and the control signals UNSELdis and BLKWLdis are high, i.e., the memory block BLK(k) is unselected, the output signal of the NAND gate G3 is made high. In this case, the output signal of the NAND gate G3 denotes block selecting information. That is, an output signal of a NAND gate G3 in a selected memory block is made low, while an output signal of a NAND gate G3 in an unselected memory block is made high. An output signal of an NAND gate G3 in each memory block is synchronized with the block selecting information.

Figure 8:
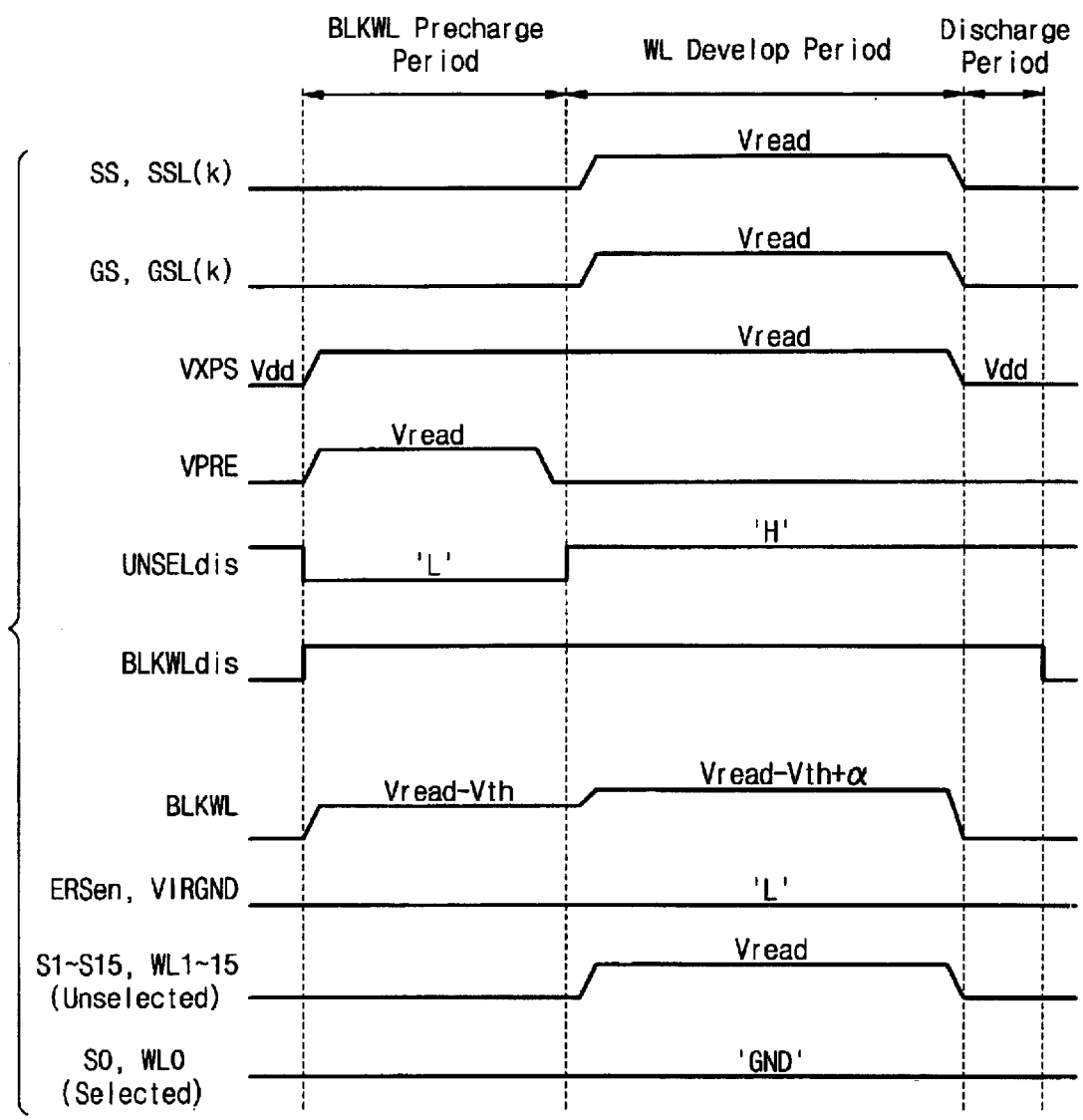
FIG. 8 is a timing diagram for explaining operations of the row decoder, the bias circuit, and the block selecting switch circuit in a read operation.

A timing view for explaining operations of the row decoder, the bias circuit, and the block selecting switch circuit of FIG. 7 is illustrated in FIG. 8. To simplify the explanation, assuming that a memory block BLK(k) and its wordline WL0 are selected. A read operation is divided into a block wordline precharge period, a wordline develop period, and a discharge period. A control signal UNSELdis is held low during the block wordline precharge period, and is held high during the wordline develop period and the discharge period. A control signal BLKWLdis is automatically made high when an erase/read/program operation is started. In this case, the low level has a ground voltage (GND) level and the high level has a power supply voltage (Vcc) level.

Since an output signal of a NAND gate G2 in a row decoder X-DEC(k) corresponding to a selected memory block BLK(k) is made high during the block wordline precharge period, an NMOS transistor M5 of the row decoder X-DEC(k) is turned off. In the block wordline precharge period, a Vread voltage is applied to an NMOS transistor M3, as illustrated in FIG. 8. Thus, a block wordline BLKWL(k) of the row decoder X-DEC(k) is precharged (Vread−Vth; Vread is approximately 5V and Vth represents a threshold voltage of an NMOS transistor) via the NMOS transistor M3. NAND gates G2 of row decoders X-DEC(k+1) and X-DEC(k−1) corresponding to remaining unselected memory blocks (e.g., BLK(k+1) and BLK(k−1)) output a low level signal, respectively. As a result, each NMOS transistor M5 of the row decoders BLK(k+1) and BLK(k−1) is turned on. For that reason, block wordlines BLKWL(k+1) and BLKWL(k−1) are made low, and the NMOS transistors B0–B17 of switch circuits SW(k+1) and SW(k−1) are turned off. This means that a string selecting line, wordlines, and a ground selecting line of an unselected memory block are floating.

In the wordline develop period, when driving lines SS, S1–S15, and GS are activated by a Vread voltage, a precharge voltage Vread−Vth of the block wordline BLKWL(k) will be increased up to Vread−Vth+α by self-boosting that is carried out through NMOS transistors B0–B17 of a switch circuit SW(k). Here, the "α" is ΔV which is decided by a coupling ratio. The ΔV is lower than a Vread+Vth voltage because a voltage charged to the block wordline BLKWL(k) is limited by a diode-coupled NMOS transistor M4.

During the wordline develop period, Vread voltages of the driving lines SS, S1–S15, and GS are supplied to a ground selecting line GSL(k), wordlines WL2–WL15, and a string selecting line SSL(k) via turned-on NMOS transistors B0–B17 of the switch circuit SW(k), respectively. A selected wordline WL0 receives a voltage of 0V from a driving line S0 in the wordline develop period. Based on a conventional manner, data stored in memory cells of the selected wordline WL0 is then sensed by a page buffer circuit.

Since string selecting line SSL(k) of the selected memory block BLK(k) is electrically connected to a string selecting line SSL(k+1) of an adjacent unselected memory block BLK(k+1), the Vread voltage is also applied to a string selecting line SSL(k+1) of the unselected memory block BLK(k+1). This allows cell strings of the unselected memory block BLK(k+1) to be coupled to corresponding bitlines. Likewise, since a ground selecting line GSL(k) of the selected memory block BLK(k) is electrically connected to a ground selecting line GSL(k−1) of an adjacent unselected memory block BLK(k−1), the Vread voltage is also applied to a ground selecting line SSL(k+1) of the unselected memory block BLK(k−1).

A NAND gate G3 of a row decoder X-DEC(k) corresponding to the selected memory block BLK(k) outputs a low level signal in the wordline develop period. Meanwhile, each NAND gate G3 of row decoders X-DEC(k+1) and X-DEC(k−1) respectively corresponding to unselected memory blocks (e.g., BLK(k+1) and BLK(k−1)) outputs a high level signal in the wordline develop period. In a bias circuit between the memory blocks BLK(k+1) and BLK(k), an NMOS transistor M7 is turned on and an NMOS transistor M6 is turned off. Likewise, in a bias circuit between the memory blocks BLK(k) and BLK(k−1), an NMOS transistor M7 is turned off and an NMOS transistor M6 is turned on. This means that a ground selecting line GSL(k) shared with a string selecting line SSL(k) retains the Vread voltage.

On the other hand, in a bias circuit coupled to a shared string selecting line SSL(k−1) of the unselected memory block BLK(k−1), because both NMOS transistors M7 and M6 are turned on, the shared string selecting line SSL(k−1) is connected to a voltage supply terminal VIRGND having a ground voltage via NMOS transistors M6 and M7. That is, string selecting transistors of an unselected memory block BLK(k−1) adjacent to a selected memory block BLK(k−1) are turned off. This means that although the ground selecting line BLK(k−1) shared with the selecting memory block BLK(k) is driven by the Vread voltage, a current path formed by a cell string of the unselected memory block BLK(k−1) is shut off.

Thereafter, a series of the read operation will be finished as voltages of wordlines lines, a string, and ground selecting lines are discharged in a discharge period.

In a case where the program operation is carried out, shared string/ground selecting lines are to be controlled similar to the foregoing read operation. In a case where the erase operation is carried out (ERsen: Vread), a predetermined voltage (e.g., 0V-0.8V) is applied to wordlines of a selected memory block and wordlines of an unselected memory block remain floating. String selecting lines and ground selecting lines of all memory blocks must are kept floating. Since a power supply voltage Vcc is supplied to the voltage supply terminal VIRGND, a string/ground selecting line is precharged by a Vcc−Vth voltage. An NMOS transistor M7 constituting a bias circuit is shut off to keep the string/ground selecting line floating.

Figure 9:
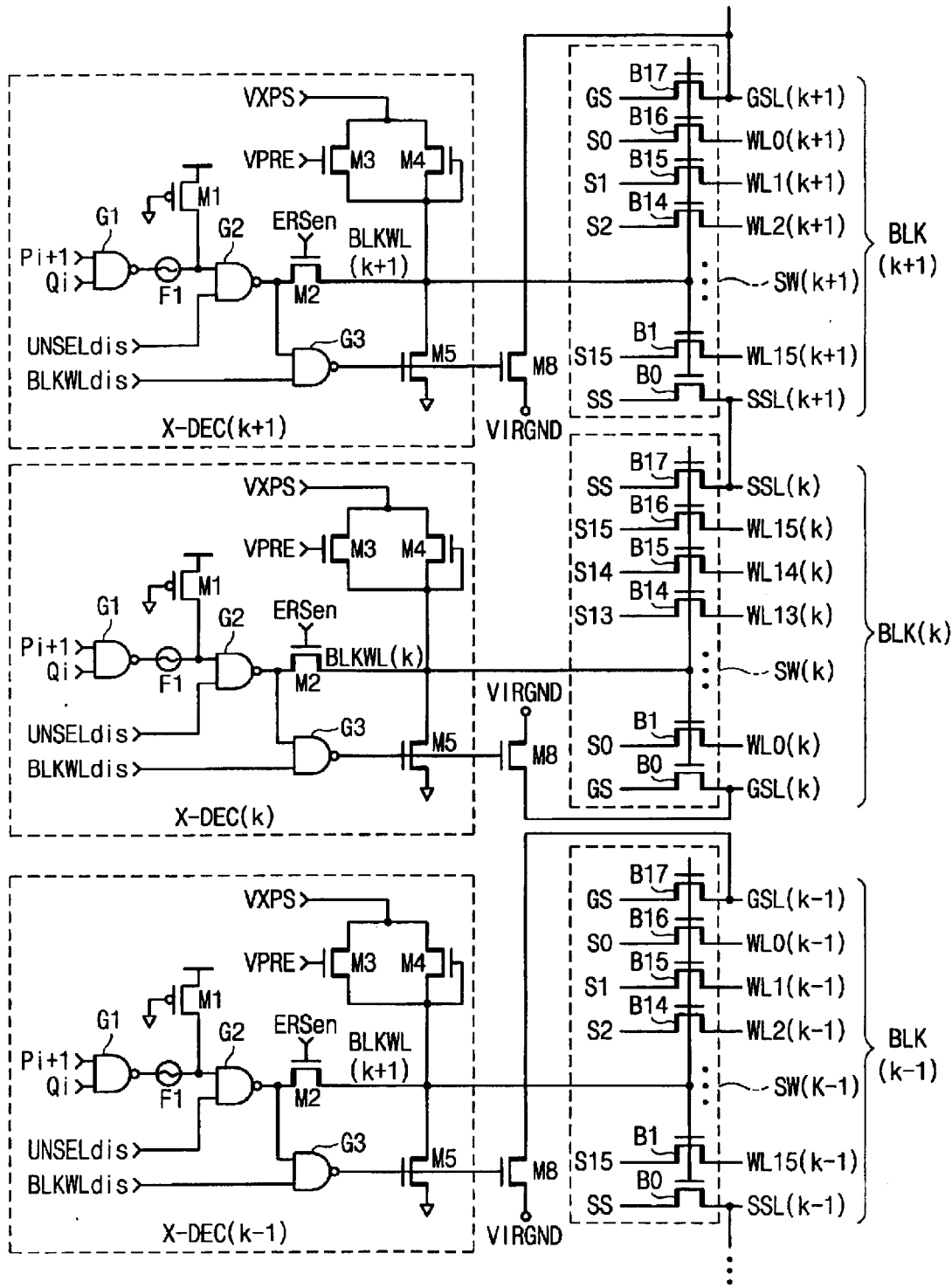
FIG. 9 is a circuit diagram of a row decoder, a bias circuit, and a block selecting switch circuit according to another embodiment of the present invention.

FIG. 9 illustrates a row decoder, a bias circuit, and a block selecting switch circuit according to another embodiment of the present invention, in which same numerals denote same elements as illustrated in FIG. 7. In this embodiment, string selecting lines of adjacent memory blocks are shared with each other while ground selecting lines thereof are not shared. For example, a string selecting line SSL(k) of a selected memory block BLK(k) is electrically connected to a string selecting line SSL(k+1) of an unselected memory block BLK(k+1) by sharing a butting contact based on the same manner as in the first embodiment. The memory blocks BLK(k) and BLK(k+1) are symmetrically disposed on the basis of shared string selecting lines.

A ground selecting line GSL(k) of the selected memory block BLK(k) is connected to a voltage supply terminal VIRGND via an NMOS transistor M8, acting as a bias circuit. Since a NAND gate G3 of a row decoder corresponding to a selected memory block outputs a low level signal in a wordline develop period, a ground selecting line GSL(k) will normally be driven by a Vread voltage. A ground selecting line GSL(k+1) of an unselected memory block BLK(k+1) is connected to a voltage supply terminal VIRGND via an NMOS transistor M8, acting as a bias circuit. Since a NAND gate G3 of a row decoder corresponding to an unselected memory block outputs a high level signal in the wordline develop period, a ground selecting line GSL(k+1) receives a ground voltage in read/program operations and keeps floated in an erase operation. This means that although string selecting lines are shared with each other, an unwanted current path is shut off through a cell string of the unselected memory block.

It will be understood that effects of the second embodiment are very similar to those of the first embodiment. That is, an area along a bitline as well as an area along a wordline is reduced.

Figure 10:
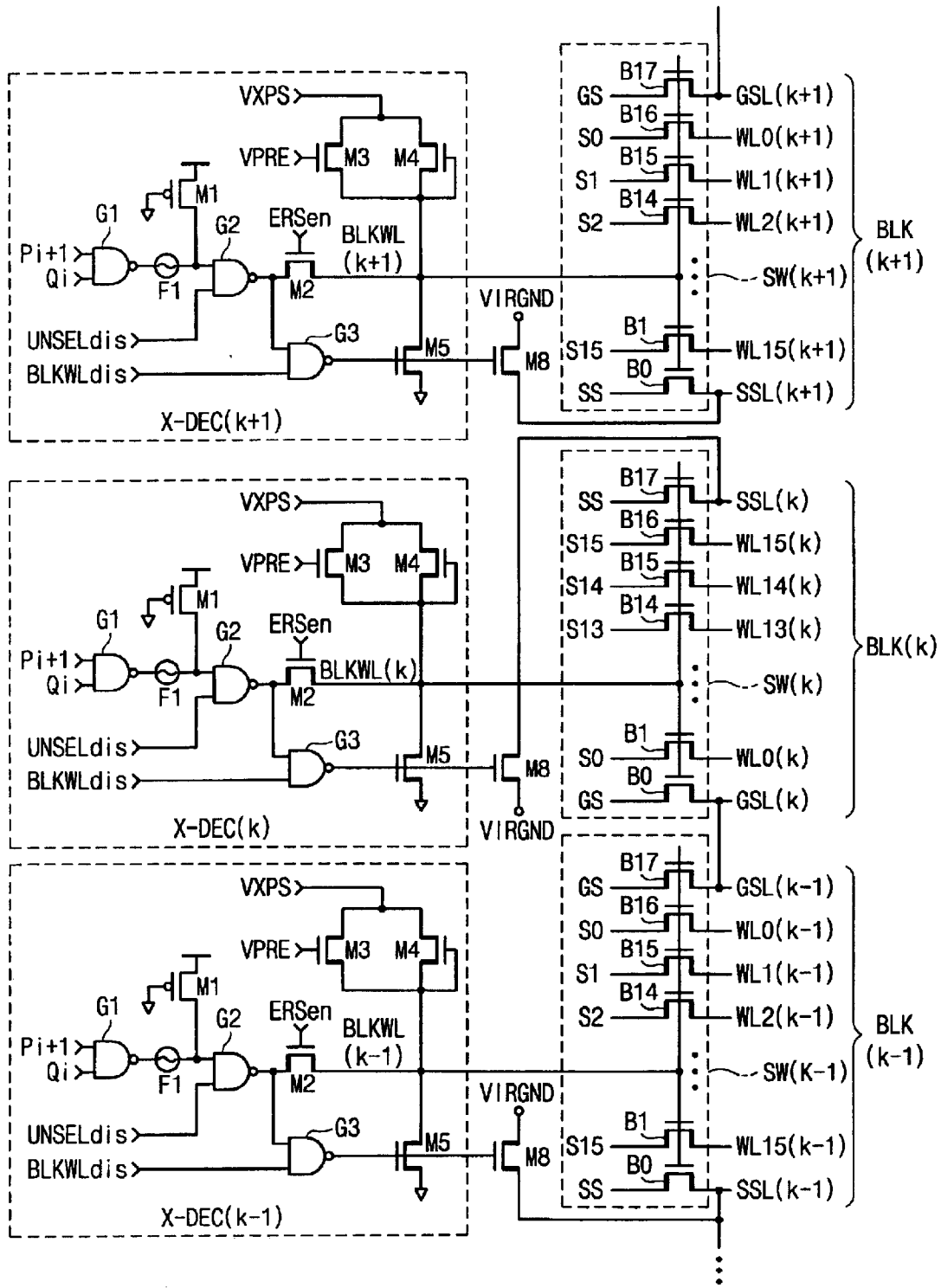
FIG. 10 is a circuit diagram of a row decoder, a bias circuit, and a block selecting switch circuit according to another embodiment of the present invention.

FIG. 10 illustrates a row decoder, a bias circuit, and a block selecting switch circuit according to another embodiment of the present invention, in which same numerals denote same elements as illustrated in FIG. 7. In this embodiment, ground selecting lines of adjacent memory blocks are shared with each other while string selecting lines thereof are not shared. For example, a ground selecting line GSL(k) of a selected memory block BLK(k) is electrically connected to a ground selecting line GSL(k−1) of an unselected memory block BLK(k−1) by sharing a butting contact based on the same manner as in the first embodiment. The memory blocks BLK(k) and BLK(k−1) are symmetrically disposed on the basis of shared ground selecting lines.

A string selecting line SSL(k) of the selected memory block BLK(k) is connected to a voltage supply terminal VIRGND via an NMOS transistor M8, acting as a bias circuit. Since a NAND gate G3 of a row decoder corresponding to a selected memory block outputs a low level signal in a wordline develop period, a string selecting line SSL(k) will normally be driven by a Vread voltage. A string selecting line SSL(k−1) of an unselected memory block BLK(k−1) is connected to a voltage supply terminal VIRGND via an NMOS transistor M8, acting as a bias circuit. Since a NAND gate G3 of a row decoder corresponding to an unselected memory block outputs a high level signal in the wordline develop period, a string selecting line SSL(k−1) receives a ground voltage in read/program operations and remains floating in an erase operation. This means that although ground selecting lines are shared with each other, an unwanted current path is shut off through a cell string of the unselected memory block.

It will be understood that effects of the this embodiment are very similar to those of the first embodiment. That is, an area along a bitline as well as an area along a wordline is reduced.

It is apparent to a person skilled in the art that a layout structure of a memory cell array and a scheme for controlling a string/ground selecting line according to the invention can identically be applied to a memory block for redundancy.

In summary, ground and/or string selecting lines of adjacent memory blocks are electrically connected to each other so that ground and/or string selecting transistors, adjacent along a bitline, can share a butting contact. As a result, an area along a wordline as well as an area along a bitline is considerably reduced. Furthermore, the layout of a row decoder within a small string pitch is easy.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A NAND-type flash memory device comprising:
   first and second memory blocks each including a plurality of cell strings that are connected to bitlines, respectively,
   wherein each of the cell strings has a string selecting transistor coupled to a corresponding bitline, a ground selecting transistor coupled to a common source line, and a plurality of memory cells serially connected between the string and ground selecting transistors,
   wherein the string selecting transistor of the respective cell strings is coupled to a string selecting line, the ground selecting transistor is coupled to a ground selecting line, and the memory cells are coupled to corresponding wordlines, respectively, and
   wherein a selecting line of the first memory block is electrically connected to a selecting line of the second memory block in order to share a butting contact.

2. The NAND-type flash memory device as recited in claim 1, wherein when the string selecting line of the first memory block is electrically connected to the string selecting line of the second memory block, and wherein the first and second memory blocks are symmetrically disposed on the basis of the string selecting lines that are electrically connected to each other.

3. The NAND-type flash memory device as recited in claim 1, further comprising a bias circuit that supplies a ground voltage to the shared string selecting lines in read and program operations and floats the shared string selecting lines in an erase operation, wherein the bias circuit operates in response to information for selecting the first memory block and information for selecting the second memory block.

4. The NAND-type flash memory device as recited in claim 1, further comprising a third memory block having a plurality of cell strings that are coupled to the bitlines, respectively, wherein each of the cell strings in the third memory block is made of a string selecting transistor coupled to a corresponding bitline, a ground selecting transistor coupled to a common source line, and a plurality of memory cells serially connected between the string and ground selecting transistors, and wherein the string selecting transistor of the respective cell strings is coupled to a string selecting line, the ground selecting transistor is coupled to a ground selecting line, and the memory cells are coupled to corresponding wordlines, respectively.

5. The NAND-type flash memory device as recited in claim 4, wherein a ground selecting line of the first memory block is electrically connected to a ground selecting line of the third memory block in order to share a butting contact.

6. The NAND-type flash memory device as recited in claim 5, further comprising a bias circuit that supplies a ground voltage to the shared ground selecting lines in read and program operations and floats the shared ground selecting lines in an erase operation, wherein the bias circuit operates in response to block selecting information for selecting the first memory block and block selecting information for selecting the third memory block.

7. A NAND-type flash memory device comprising:

first, second, and third memory blocks each including a plurality of cell strings that are coupled to bitlines, respectively, wherein each of the cell strings has a string selecting transistor coupled to a corresponding bitline, a ground selecting transistor coupled to a common source line, and a plurality of memory cells serially connected between the string and ground selecting transistors, wherein the string selecting transistor of the respective cell strings is coupled to a string selecting line, the ground selecting transistor is coupled to a ground selecting line, and the memory cells are coupled to corresponding wordlines, respectively, and wherein a string selecting line of the first memory block is electrically connected to a string selecting line of the second memory block in order to share a butting contact, and a ground selecting line of the first memory block is shared with a ground selecting line of the third memory block in order to share a second butting contact.

8. The NAND-type flash memory device as recited in claim 7, further comprising a bias circuit that supplies a ground voltage to the shared string selecting lines in read and program operations and floats the shared string selecting lines in an erase operation, wherein the bias circuit operates in response to information for selecting the first memory block and information for selecting the second memory block.

9. The NAND-type flash memory device as recited in claim 7, wherein the first and third memory blocks are symmetrically disposed on the about the ground selecting lines that are electrically connected to each other.

10. The NAND-type flash memory device as recited in claim 7, further comprising a bias circuit that supplies a ground voltage to the shared ground selecting lines in read and program operations and floats the shared ground selecting lines in an erase operation, wherein the bias circuit operates in response to block selecting information for selecting the first memory block and block selecting information for selecting the third memory block.

11. A NAND-type flash memory device comprising:

first and second memory blocks each including a plurality of cell strings that are coupled to bitlines, respectively, wherein each of the cell strings has a string selecting transistor coupled to a corresponding bitline, a ground selecting transistor coupled to a common source line, and a plurality of memory cells serially connected between the string and ground selecting transistors, wherein the string selecting transistor of the respective cell strings is coupled to a string selecting line, the ground selecting transistor is coupled to a ground selecting line, and the memory cells are coupled to corresponding wordlines, and wherein a string selecting line of the first memory block is electrically connected to a string selecting line of the second memory block in order to share a butting contact.

12. The NAND-type flash memory device as recited in claim 11, wherein the first and second memory blocks are symmetrically disposed about the string selecting line that are electrically connected to each other.

13. The NAND-type flash memory device as recited in claim 11, further comprising:

a first bias circuit for, in response to first block selecting information for selecting the first memory block, supplying a ground voltage to the ground selecting line of the first memory block in read/program operations and floating the ground selecting line of the first memory block in an erase operation; and a second bias circuit for, in response to second block selecting information for selecting the second memory block, supplying a ground voltage to the ground selecting line of the second memory block in read/program operations and floating the ground selecting line of the second memory block in an erase operation.

14. A NAND-type flash memory device comprising:

first and second memory blocks each including a plurality of cell strings that are coupled to bitlines, respectively, wherein each of the cell strings has a string selecting transistor coupled to a corresponding bitline, a ground selecting transistor coupled to a common source line, and a plurality of memory cells serially connected between the string and ground selecting transistors, wherein the string selecting transistor of the respective cell strings is coupled to a string selecting line, the ground selecting transistor is coupled to a ground selecting line, and the memory cells are coupled to corresponding wordlines, and wherein a ground selecting line of the first memory block is electrically connected to a ground selecting line of the second memory block in order to share a butting contact.

15. The NAND-type flash memory device as recited in claim 14, wherein the first and second memory blocks are symmetrically disposed about the ground selecting lines that are electrically connected to each other.

16. The NAND-type flash memory device as recited in claim 14, further comprising:
a first bias circuit for, in response to first block selecting information for selecting the first memory block, supplying a ground voltage to the ground selecting line of the first memory block in read/program operations and floating the ground selecting line of the first memory block in an erase operation; and
a second bias circuit for, in response to second block selecting information for selecting the second memory block, supplying a ground voltage to the ground selecting line of the second memory block in read/program operations and floating the ground selecting line of the second memory block in an erase operation.

17. A NAND-type flash memory device comprising:
first, second, and third memory blocks each including a plurality of cell strings that are coupled to bitlines, respectively,
wherein the each of the cell strings has a string selecting transistor coupled to a corresponding bitline, a ground selecting transistor coupled to a common source line, and a plurality of memory cells serially connected between the string and ground selecting transistors,
wherein the string selecting transistor of the respective cell strings is coupled to a string selecting line, the ground selecting transistor is coupled to a ground selecting line, and the memory cells are coupled to corresponding wordlines, respectively,
wherein a string selecting line of the first memory block is electrically connected to a string selecting line of the second memory block in order to share a butting contact, and a ground selecting line of the first memory block is shared with a ground selecting line of the third memory block in order to share a butting contact;
a first bias circuit for supplying a ground voltage to the ground selecting line of the first memory block in read/program operations and floating the ground selecting line of the first memory block in an erase operation; and
a second bias circuit for supplying a ground voltage to the ground selecting line of the second memory block in read/program operations and floating the ground selecting line of the second memory block in an erase operation.

18. The NAND-type flash memory device as recited in claim 17, wherein the first bias circuit operates in response to block selecting information for selecting the first memory block and block selecting information for selecting the second memory block.

19. The NAND-type flash memory device as recited in claim 17, wherein the second bias circuit operates in response to block selecting information for selecting the first block and the block selecting information for selecting the third memory block.

20. A NAND-type flash memory device comprising:
first and second memory blocks each including a plurality of cell strings that are coupled to bitlines, respectively,
wherein each of the cell strings has a string selecting transistor coupled to a corresponding bitline, a ground selecting transistor coupled to a common source line, and a plurality of memory cells serially connected between the string and ground selecting transistors,
wherein the string selecting transistor of the respective cell strings is coupled to a string selecting line, the ground selecting transistor is coupled to a ground selecting line, and the memory cells are coupled to corresponding wordlines,
wherein a string selecting line of the first memory block is electrically connected to a string selecting line of the second memory block in order to share a butting contact;
a first bias circuit for supplying a ground voltage to the ground selecting line of the first memory block in read/program operations and floating the ground selecting line of the first memory block in an erase operation; and
a second bias circuit for supplying a ground voltage to the ground selecting line of the second memory block in read/program operations and floating the ground selecting line of the second memory block in an erase operation.

21. A NAND-type flash memory device comprising:
first and second memory blocks each including a plurality of cell strings that are coupled to bitlines, respectively,
wherein each of the cell strings has a string selecting transistor coupled to a corresponding bitline, a ground selecting transistor coupled to a common source line, and a plurality of memory cells serially connected between the string and ground selecting transistors,
wherein the string selecting transistor of the respective cell strings is coupled to a string selecting line, the ground selecting transistor is coupled to a ground selecting line, and the memory cells are coupled to corresponding wordlines,
wherein a ground selecting line of the first memory block is electrically connected to a ground selecting line of the second memory block in order to share a butting contact;
a first bias circuit for supplying a ground voltage to the ground selecting line of the first memory block in read/program operations and floating the ground selecting line of the first memory block in an erase operation; and
a second bias circuit for supplying a ground voltage to the ground selecting line of the second memory block in read/program operations and floating the ground selecting line of the second memory block in an erase operation.

22. A memory device, comprising:
a first memory block and a second memory block, each memory block including a string selecting line and a ground selecting line, and each block including a plurality of cell strings having
a string select transistor coupled to the string selecting line,
a ground select transistor coupled to the ground selecting line, and
a plurality of memory cells serially coupled between the string select transistor and the ground select transistor; and
a single butting contact coupling together one of the selecting lines in the first memory block to one of the selecting lines in the second memory block.

23. The memory device of claim 22 wherein the single butting contact is electrically connected to a first biasing circuit.

24. The memory device of claim 22, further comprising:
a third memory block including a string selecting line and a ground selecting line; and
a second single butting contact coupling together one of the selecting lines in the first memory block to one of the selecting lines in the third memory block.

25. The memory device of claim 24, wherein the single butting contact is electrically connected to a first biasing circuit, and wherein the second single butting contact is electrically connected to a second biasing circuit.

26. The memory device of claim 25 wherein the single butting contact is electrically connected to the string selecting lines of the first memory block and the second memory block, and wherein the second single butting contact is electrically connected to the ground selecting lines of the first memory block and the third memory block.

* * * * *